United States Patent [19]

Hicks

[11] 4,147,978
[45] Apr. 3, 1979

[54] SYSTEM FOR MONITORING ELECTRICAL ENERGY CONSUMPTION

[75] Inventor: John R. Hicks, Irving, Tex.

[73] Assignee: Dupont Energy Management Corporation, Irving, Tex.

[21] Appl. No.: 861,899

[22] Filed: Dec. 19, 1977

[51] Int. Cl.² .................................. G01R 21/06
[52] U.S. Cl. .............................................. 324/142
[58] Field of Search ................ 324/142; 235/151.21, 235/151.31

[56] References Cited

U.S. PATENT DOCUMENTS

| | | | |
|---|---|---|---|
| 3,517,311 | 6/1970 | Wasielewski et al. | 324/142 |
| 3,900,794 | 8/1975 | Bell | 324/142 |
| 3,942,110 | 3/1976 | Milkovic | 324/142 |
| 3,953,795 | 4/1976 | Brunner et al. | 324/142 |
| 4,056,774 | 11/1977 | Shum | 324/142 |
| 4,079,313 | 3/1978 | Callan | 324/142 |
| 4,080,568 | 3/1978 | Funk | 324/142 |

FOREIGN PATENT DOCUMENTS

| | | | |
|---|---|---|---|
| 472677 | 6/1969 | Switzerland | 324/142 |
| 432403 | 8/1975 | U.S.S.R. | 324/142 |

OTHER PUBLICATIONS

Kusui et al., Metering Apparatus & Tariffs for Electricity Supply, IEE, Conference Publication No. 92, Sep. 1972, pp. 329-334.

Friedl et al., Published IEE Lecture, Paper No. 117, Sep. 1972, 6 pages.

Primary Examiner—Stanley T. Krawczewicz
Attorney, Agent, or Firm—Hubbard, Thurman, Turner, Tucker & Glaser

[57] ABSTRACT

An electronic monitoring circuit measures the amount of energy consumed by a system and displays the corresponding cost of the energy. An alarm circuit is triggered if the cost exceeds a predetermined amount over a given period of time. The monitoring circuit includes an electromagnetic coil which senses the magnitude of the input current and generates a d-c voltage having an amplitude corresponding to the current magnitude. The d-c voltage drives a voltage-controlled oscillator to generate an a-c signal having a frequency corresponding to the d-c voltage amplitude. The oscillator has been preset so that the generated a-c signal has a frequency representing a unit of cost of electrical power corresponding to the sensed current magnitude. A multivibrator generates a pulsed digital signal corresponding to the a-c signal frequency, each pulse indicating a unit of cost for the electrical power consumed. The pulses are accumulated in a series of decade counters which are connected through a decoder to a seven segment readout unit for displaying the cumulative cost of the energy consumed. The counters are monitored by an alarm circuit which is triggered in response to the count exceeding a predetermined value in a given period of time. Reset circuits periodically returns the counters and alarm circuit to zero to begin a new monitoring period.

17 Claims, 4 Drawing Figures

SYSTEM FOR MONITORING ELECTRICAL ENERGY CONSUMPTION

BACKGROUND AND SUMMARY OF THE INVENTION

This invention is concerned with electrical energy monitoring circuitry and more particularly with electronic circuitry for measuring the amount of energy consumed by a system, displaying the corresponding cost of the energy and controlling and monitoring the resultant cost against a predetermined standard.

In the last few years, dramatic increases in the price of natural gas and oil have resulted in sharp rises in the cost of electricity for consumer use. Various incentives and programs have been pursued by state and federal governments and other institutions for the purpose of eliminating the waste of energy and developing more efficient energy sources. The consuming public, especially homeowners and industrial users of electrical energy, have become increasingly conscious of the need for energy conservation.

In spite of the foregoing developments, it has been difficult if not impossible for a consumer of electrical energy to readily and continually monitor the amount of energy he is using. The resulting cost is normally not made available to the user until a monthly statement is received, some time after the electrical energy is consumed and the charges are incurred. This delay can be especially damaging during periods of high power consumption or in situations where power consuming appliances or apparatus are inadvertently left running for long periods of time.

It is possible for a consumer to manually monitor his electrical energy consumption through periodic readings of his electric meter and to calculate the charges, but the procedure is difficult and cumbersome and is therefore not practical. Moreover, present systems do not provide for feedback control to reduce, moderate or shut off the electrical power input when the maximum desired energy usage has been reached.

The present invention provides a system for generating and displaying to the consumer the cost of electrical energy being used and for monitoring or controlling the amount of energy consumed over a given period of time. The circuit senses the electrical power flowing into the system and generates a digital signal representative of the amount of electrical power being received. Accumulator means count the digital signal pulses during a predetermined period of time. When the count exceeds a designated maximum, an output signal is generated which can be used to actuate alarm or control circuitry.

In a more specific embodiment of the present invention, electronic circuitry is provided for monitoring the amount of electrical energy consumed by a system over an input bus during a given period of time. An electromagnetic circuit senses the magnitude of the input current and generates a d-c voltage having an amplitude representative of the magnitude of the input current. A voltage-controlled oscillator is driven by the d-c voltage to generate an a-c signal having a frequency corresponding to the amplitude of the d-c voltage. The a-c signal is fed to a multivibrator which generates a pulse train having a frequency corresponding to the frequency of the a-c signal. The oscillator and multivibrator are preset so that the resultant pulse train corresponds to a unit cost of electrical energy.

The pulse train is fed to a series of digital counters which count the number of pulses generated. The counters are connected through decode circuitry to a display unit which continually reads out the cost of the electrical energy being consumed. The counters are sensed to generate an output signal in response to the count reaching a predetermined value. An alarm circuit is responsive to the output signal to indicate that the maximum desired amount of electrical energy has been consumed for a given period of time.

The above invention has a number of advantages for an electrical energy consumer. The on-line monitoring system provides up-to-date information to the consumer regarding his energy usage. Data concerning cumulative energy costs are generated and continually displayed. The alarm circuitry provides a warning when desired costs are exceeded, and the control circuitry can automatically modify or discontinue electrical service at that point. The system is easily connected to incoming power lines by electromagnetic means, and is compact and portable to accommodate a variety of applications.

BRIEF DESCRIPTION OF THE DRAWINGS

A more complete understanding of the invention may be had by referring to the following detailed description when taken in conjunction with the drawings wherein.

DETAILED DESCRIPTION OF THE DRAWINGS

Figure 1:
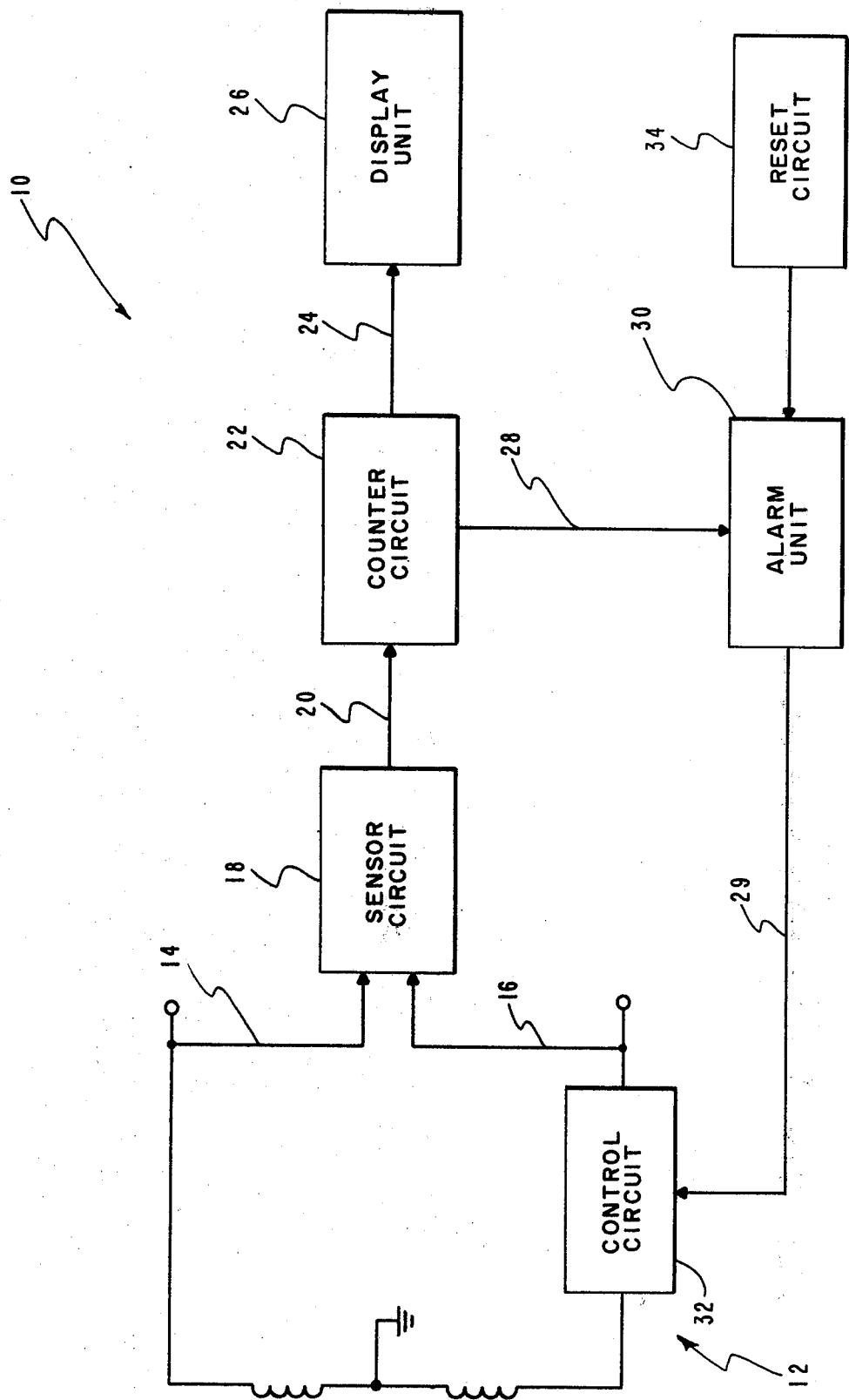
FIG. 1 is a block diagram of the electrical energy monitoring system embodying the present invention.

Referring now to FIG. 1, the electrical energy monitoring circuitry 10 of the present invention is shown. Preferably, circuitry 10 is connected to both legs on the secondary side of an input power transformer 12. Input lines 14 and 16 feed into a sensor circuit 18 which detects the magnitude of current flowing through transformer 12 and generates a digital pulse train on line 20 having a frequency corresponding to the amplitude of the input current. Counter circuit 22 counts the incoming pulses on line 20 over a given period of time and generates signals indicative of the cost of the electrical power being used. These signals are continually fed on line 24 to a display unit 26 which decodes the signals and displays them in a dollar-and-cents format.

The pulses are also directed on line 28 to counters within alarm unit 30. If the counted pulse signals exceed a desired amount within a predetermined period of time, an alarm signal is generated by the alarm counters to warn the user of the excessive cost being incurred. At the same time, a control signal is directed by a line 29 to a control circuit 32 in the secondary of the input transformer 12 which can shut down or modify incoming power to the system. Circuit 32 may be any type of conventional control circuit, including a simple switch unit. Therefore, a detailed discussion of the components of circuit 32 is not necessary here. At the end of the desired period of time, a reset circuit 34 zeros the counters of alarm unit 30 to begin a new period. The counters of counter circuit 22 may be reset at the same time.

Figure 2:
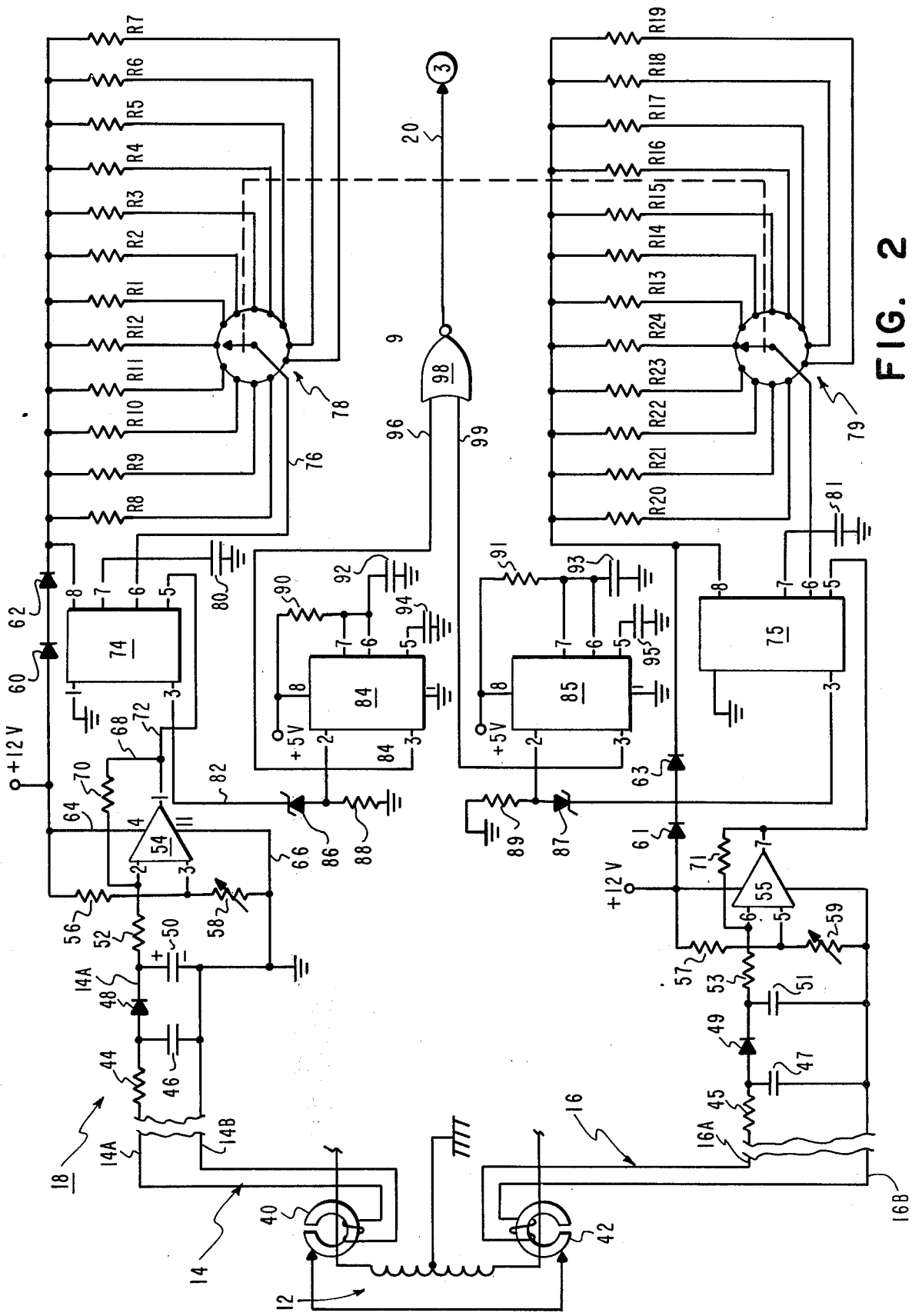
FIG. 2 is a circuit diagram of the sensor circuit of the system shown in FIG. 1.

Referring now to FIG. 2, the sensor circuit 18 is shown in greater detail. Lines 14 and 16 are preferably connected to the secondary legs of transformer 12 by means of electromagnetic sensors 40 and 42 clamped around the transformer legs. Since power is delivered along each leg of the two-phase transformer, identical sensor circuits are used for both phases to determine the full magnitude of power being delivered to the system.

Referring first to the circuitry connected to sensor 40, input lines 14a and 14b are connected to a resistor 44 and a capacitor 46 in series and in parallel, respectively, so as to provide a desired impedance to the coil in sensor 40. A rectifier 48 is connected to the common terminal between resistor 44 and capacitor 46 to convert the induced a-c signal to a d-c voltage having an amplitude corresponding to the amount of input current. A capacitor 50 is connected between the other side of rectifier 48 and ground. The input signal is fed on line 14a through an input resistor 52 to one input lead of an amplifier 54. The other input is connected through a biasing resistor 56 to a positive 12 volt power source and through a variable resistor 58 to ground. Biasing of amplifier 54 is connected through line 64 to the 12 volt power source and the ground is provided through line 66. The output of amplifier 54 includes a feedback loop 68 through resistor 70 to input line 14a.

Output line 72 of amplifier 54 feeds to the input pin 5 of a voltage-controlled oscillator (VCO) 74. Bias pins 6 and 8 of oscillator 74 are connected across a multiple resistor selector 78. Selector 78 includes resistors R1 through R12 having different values which can be selected to correlate with the cost of electrical power being consumed. Oscillator 74 is powered on pin 8 from the twelve volt power supply through diodes 60 and 62 and is grounded through pin 1. Oscillator 74 is connected at pin 7 through a capacitor 80 to ground. The selected resistance between pins 6 and 8, and capacitor 80 at pin 7 provide the R-C time constant for oscillator 74.

The output of oscillator 74 is fed from pin 3 along line 82 to input pin 2 of a multivibrator (MV) 84 through a zener diode 86. Input pin 2 is connected to ground through a biasing resistor 88. Multivibrator 84 is powered through pin 8 by a common 5 volt power supply which is also connected to pins 6 and 7 through resistor 90. Pins 6 and 7 are also connected through a capacitance 92 to ground, Resistor 90 and capacitance 92 provide the R-C time constant for multivibrator 84. Pin 5 of multivibrator 84 is connected through a bypass capacitor 94 to ground.

The ouput of multivibrator 84 is fed through pin 3 along line 96 to one input of a NOR gate 98. The other input line 99 of the NOR gate is received from an identical d-c circuit connected to lines 16a and 16b on the other leg of transformer 12. Since that circuit is identical to the one just described, it is not described in detail. The output of NOR gate 98 is fed along output line 20 to the counter circuitry 22 shown in FIG. 3.

Figure 3:
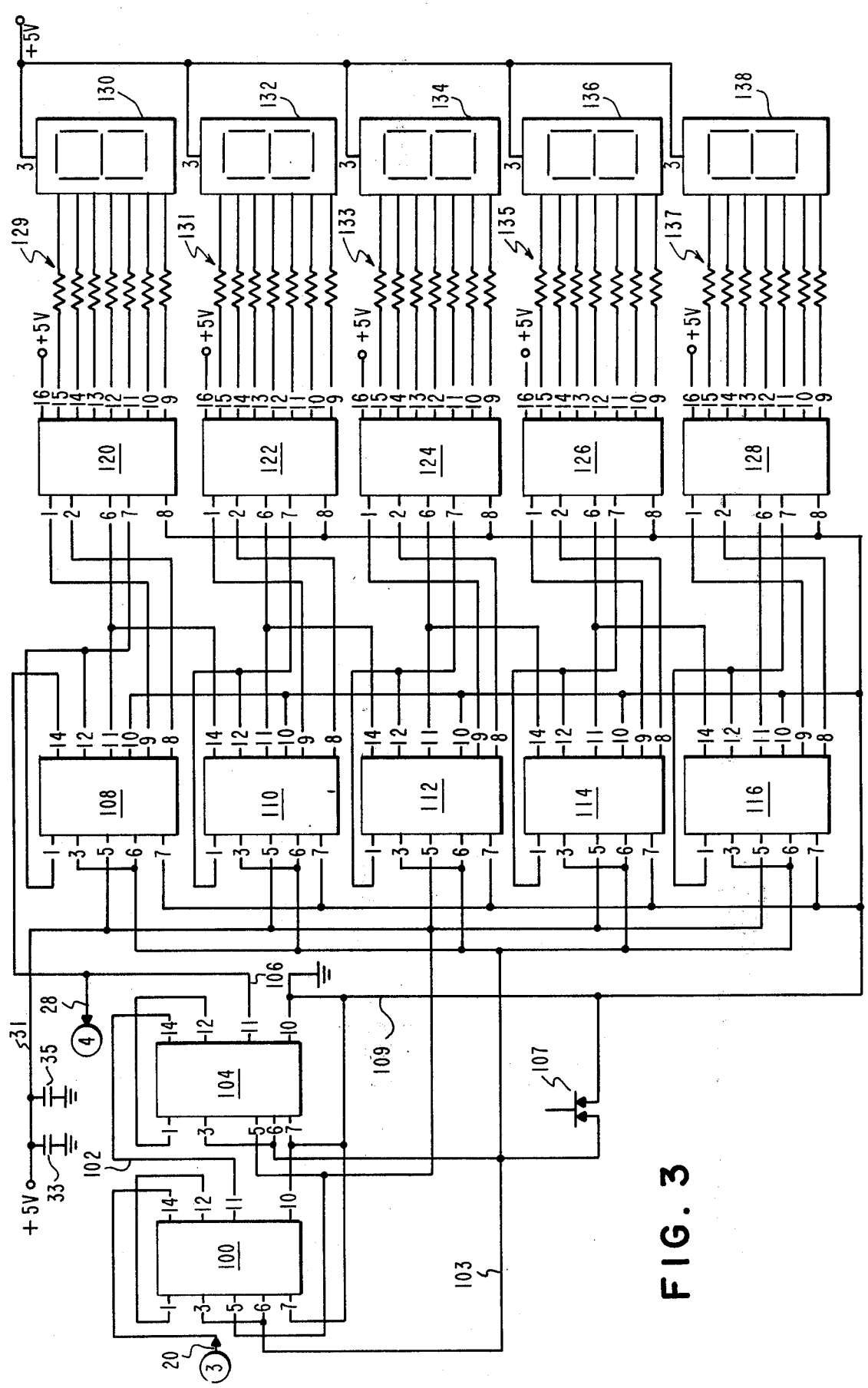
FIG. 3 is a circuit diagram of the counter circuit and display unit of the system shown in FIG. 1.

Referring now to FIG. 3, the counter circuitry 22 and display unit 26 are shown in greater detail. Input line 20 is fed to input pin 14 of a decade counter 100. The output from counter 100 is fed along line 102 to input pin 14 of decade counter 104. Pins 1 and 12 of counter 100 are tied to each other to achieve the divide-by-ten operation by the counter circuit. Pin 3 is connected to pin 6 and pin 7 is connected to pin 10. The pins of counter 104 are interconnected in the same fashion. Pins 5 of counters 100 and 104 are interconnected as are pin pairs 3 and 6 and pin pairs 7 and 10 of both counters.

The signal from counter 104 is fed to a bank of five more series-connected decade counters 108, 110, 112, 114 and 116, each having pin connections the same as those of counters 100 and 104. The output of counter 104 is directed on line 106 to input pin 14 of decade counter 108. The other counters 110, 112, 114 and 116 are connected in series with counter 108, each being connected between output pin 11 of the preceding counter and input pin 14 of the respective counter. The pin pairs 3 and 6 of all seven counters in FIG. 3 are connected together to accommodate a common reset signal on line 103 from a manual reset button 107 connected between line 103 and ground. Pin pairs 7 and 10 are interconnected with the same pairs of all seven counters to provide a common ground. Finally, pin 5 of each of the seven counters is interconnected with the other pins 5 to provide power to the counters from the 5 volt power source on line 31. Bypass capacitors 33 and 35 are connected between line 31 and ground.

The outputs of the five counters 108-116 drive five decoder units 120, 122, 124, 126 and 128. Counter 108 interconnects with the input pins of decoder 120 with output pins 9, 8, 11 and 12 being connected to input pins 1, 2, 6 and 7 respectively, of decoder 120. Ground pin 8 of decoder 120 is commonly connected with pins 7 and 10 of all of the seven counters previously mentioned.

The other decoders are connected to their respective counters in an identical manner. Decoder 122 is connected to counter 110, decoder 124 is connected to counter 112, decoder 126 is connected to counter 114 and decoder 128 is connected to counter 116.

Each of decoders 120-128 are preferably BCD--to-seven segment decoders which convert each binary-coded decimal data signal to seven digital signals, each one turning off or on one of seven segments of a display element of display unit 26. A display element 130 is connected by seven lines through identical resistors 129 to decoder 120, and identical display elements 132, 134, 136 and 138 are connected in the same manner to decoders 122, 124, 126 and 128 respectively. Each of the display elements are driven by the common 5 volt power supply.

Figure 4:
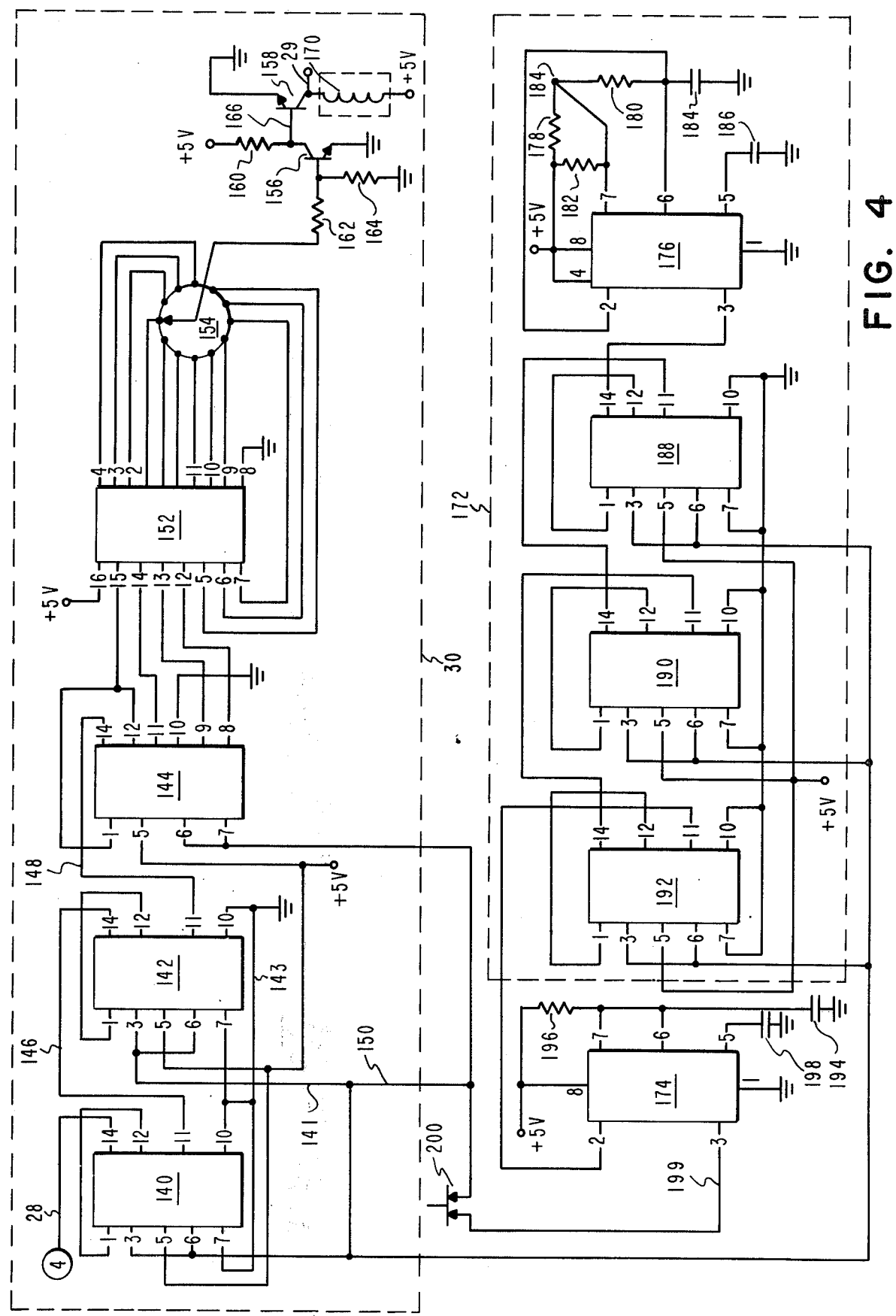
FIG. 4 is a circuit diagram of the alarm unit and reset circuit of the system shown in FIG. 1.

Referring now to FIG. 4, the alarm unit 30 and reset circuit 34 are shown in greater detail. Input line 28 is connected to line 106 between counters 104 and 108 in FIG. 3 to direct the input signals to alarm unit 30. Line 28 is directed to three counters 140, 142 and 144 connected in series. Counters 140 and 142 are decade counters and counter 144 is a divided-by-12 counter. Line 28 comes into counter 140 on pin 14 and output pin 11 of counter 140 is fed to input pin 14 of counter 142 on line 146. The output pin 11 of counter 142 is connected by line 148 to input pin 14 of counter 144. As with the counters shown in FIG. 3, pins 1 and 12 of each of counters 140, 142 and 144 are interconnected with each other. Reset pins 3 and 6 of counter 140 are interconnected with each other and on line 141 with pins 3 and 6 of counter 142 and with reset pins 6 and 7 of counter 144. Ground pins 7 and 10 of counter 140 are connected with each other and on line 143 with pins 7 and 10 of counter 142. Counters 140, 142 and 144 are each powered by the common power supply through pins 5.

Counter 144 of alarm unit 30 has four output lines from pins 8, 9, 12 and 14 to input pins 12, 13, 14 and 15 of a decoder 152. The 5 volt power supply is input on pin 16 of decoder 152. Pin 11 of counter 144 and pin 8 of decoder 152 both connect to ground. Decoder 152 converts incoming binary-coded decimal data to regular decimal data which is output to a selector switch 154 on twelve different output pins.

The output of selector switch 154 is directed to an alarm relay circuit consisting of two series-connected, emitter-grounded transistors 156 and 158, respectively. Transistor 156 is powered by the common power supply through a resistor 160 with the signal coming in through another resistor 162 to the base of transistor 156. A third transistor 164 biases the gate of transistor 156 above ground. The collector output of transistor 156 is transmitted by line 166 to the gate of transistor 158. The collector of transistor 158 is connected through a relay coil 170 to the 5 volt power supply. The control lead 29, shown in FIG. 1, is connected to the collector of transistor 158.

As shown in FIG. 4, reset circuit 34 preferably consists of a conventional timer unit 172 connected to a multivibrator 174. Timer unit 172 may include a multivibrator 176 in a basic clocking circuit. The multivibrator 176 is powered through pin 8 by the 5 volt power supply and is grounded through pin 1. The clocking circuit consists of two resistors 178 and 180 tied between pins 8 and 6. A third resistors 182 is connected between pin 8 and pin 7. Pin 7 is further connected to a node 184 between resistors 178 and 180. Pins 4 and 8 are commonly connected as are pins 2 and 6. Pin 6 is connected through a capacitor 184 to ground and pin 5 is connected through a capacitor 186 to ground.

The output pin 3 of multivibrator 176 is connected to the input pin 14 of a counter 188. The output pin 11 of counter 188 is connected to input pin 14 of a second counter 190. Output pin 11 of counter 190 is connected to input pin 14 of a third counter 192, and output pin 11 of counter 192 is connected to input pin 2 of multivibrator 174. As with the other counters previously mentioned, pins 1 and 12 of counters 188-192 are each interconnected with each other. Reset pins 3 and 6 of each of the three counters are interconnected with each other and with pins 3 and 6 of the other two counters. Counters 188, 190 and 192 are powered through pins 5 by the 5 volt power supply and are grounded by a common connection to each pin pair 7 and 10.

Multivibrator 174 is powered by the 5 volt power supply through pin 8 and is grounded by pin 1. Pins 6 and 7 are interconnected and are connected through a capacitor 194 to ground and through a resistor 196 to pin 8. Pin 5 is also connected through a capacitor 198 to ground.

The output of multivibrator 174 is connected from pin 3 along line 199 to an alarm reset switch 200, the output of which is connected through a reset line 150 to reset pins 3 and 6 of counters 140 and 142 and reset pins 6 and 7 of counter 144.

The operation of the electrical monitoring system 10 of the present invention will now be described. Referring to FIG. 2, an induced a-c signal is generated by each of electromagnetic coils 40 and 42. The a-c signal is converted by rectifier 48 to a d-c signal having an amplitude representative of the amplitude of the sensed input current. The d-c signal is then fed through amplifier 54 to oscillator 74 to generate an a-c square wave signal having a frequency representative of the amplitude of the d-c signal. The frequency of the output square wave signal is also dependent on which of the resistors R1 through R12 is selected by selector switch 78. The values of resistors R1 to R12 are chosen to reflect different electrical rates for power usage. Preferably, the resistors values will accommodate electrical rate charges from 2.5 cents per kilowatt hours to 8 cents per kilowatt hour.

The square wave signal from oscillator 74 is fed to multivibrator 84 which generates a digitally-pulsed signal of having a substantially higher frequency on line 96. This is then input to NOR gate 98 together with an identical signal on line 99 from the other half of the sensor circuit. The frequency of the pulsed signal from multivibrator 84 is constant, but the number of pulses varies according to the square wave signal frequency. The resulting output from gate 98 provides a plurality of pulses each representing a unit cost of electrical consumption. In the present circuitry, the values of resistor 90 and capacitor 92 are chosen such that the pulse signal output has a frequency of 10 milliseconds and each pulse represents 0.01 cents of electricity consumed.

Referring to FIG. 3, the pulsed signal is fed through decade counters 100 and 104 to divide the pulse frequency by 100. Thus, the output on line 106 in the present circuitry preferably represents a pulse for each 1 cent of consumed circuitry. Counters 108 through 116 then further divide the pulse frequency to provide a read-out through decoders 120-128 in dollars and cents up to a value of $999.99. The pulse train on line 106 representing 1 cent units of electrical energy consumption is also directed to the alarm circuit 30 by way of line 28.

Referring now to FIG. 4, the input pulse circuit is divided by 100 using counters 140 and 142 so that the output on line 148 has one pulse for each one dollar of electrical consumption. Counter 144 provides four BCD outputs to decoder 152 to enable conversion of the pulse signal to decimal form. Selector switch 154 may then be set at any of 12 different settings to determine the maximum amount of electrical usage tolerated before the alarm circuit is actuated. In the present example, the switch provides a choice of from one to twelve dollars of energy use during one day. Once the desired maximum is reached, decoder 152 triggers the selected output line thereby actuating transistors 156 and 158 and the alarm relay 170.

Timer 172 is a conventional timing unit which provides an output signal to multivibrator 174 whenever a reset signal is desired for the alarm circuitry. Multivibrator 174 in turn provides a pulse signal on line 199 through alarm reset switch 200 to reset decade counters 140 and 142 and divide-by-12 counter 144 at the start of each new period.

Preferably timer 172 is a 24-hour unit so that counters 140, 142 and 144 are automatically reset each day. If the selected energy cost on selector switch 154 is reached before the day is over, the alarm relay 170 is activated and reset switch 200 must be manually pushed to reset the counters 140, 142 and 144. The counters of counting circuit 22 and this display components of display unit 26 in FIG. 3 are reset manually using reset button 107 whenever desired, preferably once a month.

All of the components in circuitry 10 are preferably conventional components which can be readily obtained from any semiconductor manufacturer, for example National Semiconductor Company in San Francisco. In the preferred embodiment just described, oscillators 74 and 75 in the sensor circuit 18 are both type 556 integrated circuit chips. Multivibrators 84 and 85 of the sensor circuit 18, and multivibrators 174 and 176 of reset circuit 34 are type 555 integrated circuit timers.

Amplifiers 54 and 55 of sensor circuit 18 preferably type 324 quad operation amplifiers also formed on integrated circuit chips. Decade counters 100, 104, 108, 110, 112, 114 and 116 of counter circuitry 22, decade counters 140 and 142 of alarm circuitry 30 and decade counters 188, 190 and 192 of reset circuitry 34 are all type 7490 integrated circuit chips.

Preferably, the BCD-to-seven segment decoders 120, 122, 124, 126 and 128 of display unit 26 are type 7447 integrated circuits. Divide-by 12 counter 144 of alarm unit 30 is a type 7492 integrated circuitry chip, and decoder 152 of alarm circuitry 30 is a type 74145 integrated circuitry chip.

In the sensor circuit, the electromagnetic coils 40 and 42 are RS-3 sensors made by Amprobe. Resistors 44, 45, 56, 57, 88 and 89 of the sensor circuit are all one kilohm. Resistors 52 and 53 are 22 kilohms, and resistors 70 and 71 are 2.2 kilohms and variable resistors 58 and 59 are 10 kilohms.

Also, in the sensor circuit, capacitors 46 and 47 are 1 microfarad and capacitors 50 and 51 are 100 microfarads. Capacitors 80 and 81 are each 75 microfarads, capacitors 92 and 93 are 0.1 microfarads and capacitors 94 and 95 are 0.01 microfarads.

In the alarm circuitry 30, resistors 160, 162 and 164 are all 1 kilohm. In the reset circuitry, resistors 178 and 180 are 500 kilohms and resistor 182 is 200 kilohms. The value of resistor 196 is 10 kilohms. Capacitor 184 is 100 microfarads, capacitor 192 is 1 microfarad and capacitors 186 and 198 are 0.01 microfarads.

It is understood that the foregoing component values and types are mainly a matter of personal choice and design, and other values and types of components which will accomplish the same result may be used within the scope of the present invention.

Although a preferred embodiment of the invention has been described in detail, it is understood that various changes, substitutions and alterations can be made therein without departing from the spirit and scope of the invention as defined by the appended claims.

What is claimed is:

1. Electrical circuitry for monitoring the amount of electrical energy consumed by a multiphase system, comprising:
   a plurality of pulse generators, each comprising means for sensing the current flowing along a separate input bus into the system and generating a DC signal having an amplitude representative of the magnitude of the input current, oscillator means responsive to said DC signal for generating an AC signal having a frequency representative of the amplitude of the DC voltage, and switching means responsive to said AC signal for generating a pulsed digital signal having a frequency representative of the AC signal frequency;
   gate means for combining each of said pulsed digital signals from each of said pulse generators and outputting a combined pulse signal;
   counting means in communication with said switching means for counting the number of pulses of said combined pulse signal during a given period of time; and
   display means responsive to said counting means for displaying the pulse count during said period of time.

2. The circuitry of claim 1 wherein said sensing means comprises electromagnetic coil means for sensing the changes in the electromagnetic field about said input bus, means for generating an induced signal having an amplitude representative of the magnitude of current in said input bus, and rectifying means for converting said induced signal to said DC signal.

3. The circuitry of claim 1 wherein said DC signal comprises a DC voltage and wherein said oscillator means comprises a voltage-controlled oscillator having an impedance which is adjustable to provide an AC signal having a frequency corresponding to a unit cost per kilowatt hour of said input current.

4. The circuitry of claim 1 wherein said switching means comprises a multivibrator having a set vibrator frequency and generating a string of pulses with a frequency responsive to the frequency of said AC signal.

5. The circuitry of claim 1 wherein said counting means comprises a plurality of decade counter circuits connected in series for dividing the frequency of the pulsed digital signal.

6. The circuitry of claim 1 and further comprising:
   comparator means for comparing the number of pulses of said combined pulse signal counted by the counting means to a predetermined number during said period of time; and
   output means for generating an output signal in response to said pulse number being equal to or greater than said predetermined number.

7. The circuitry of claim 5 wherein said comparator means comprises a counter circuit connected to said plurality of decade counters to divide the frequency of said combined pulse signal, and selector switch circuitry to generate said output signal when a given count is reached by said counter circuit.

8. The circuitry of claim 1 and further comprising alarm means connected to said output means to actuate an alarm device in response to said output signal.

9. The circuitry of claim 1 and further comprising feedback control means connected to said output means for automatically modifying the amount of electrical power to said input bus in response to said output signal.

10. The circuitry of claim 1 and further comprising reset means to return the pulse count of said counting means to zero after said predetermined period of time.

11. Electrical circuitry for monitoring the amount of electrical energy consumed by multiphase system, comprising:
    a plurality of pulse generators, each comprising means for sensing the current flowing along a separate input bus into the system and generating a DC signal having an amplitude representative of the magnitude of the input current, oscillator means responsive to said DC signal for generating an AC signal having a frequency representative of the amplitude of the DC voltage, and switching means responsive to said AC signal for generating a pulsed digital signal having a frequency representative of the AC signal frequency;
    gate means for combining each of said pulsed digital signals from each of said pulse generators and outputting a combined pulse signal;
    counting means in communication with said switching means for counting the number of pulses of said combined pulse signal during a given period of time;
    comparator means for comparing the number of pulses of said combined pulse signal counted by the counting means to a predetermined number during said period of time; and output means for generating an output signal in response to said pulse number being equal to or greater than said predetermined number.

12. In electrical circuitry for monitoring the amount of electrical energy consumed by a system, including means for sensing the AC current flowing along an input bus into the system and means for generating a pulsed digital signal having a frequency representative of the magnitude of the input AC current; the improvement characterized by:

oscillator means responsive to said AC current for generating an AC signal having a frequency representative of the amplitude of the input AC current, said oscillator means having a variable impedance which is adjustable to modify said AC signal so that the frequency of said signal corresponds to a unit cost per kilowatt hour of said input current.

13. The improvement of claim 12 wherein said oscillator means comprises a voltage-controlled oscillator and wherein said variable impedance comprises a plurality of resistors, each having a different value, and a switch for connecting one of said resistors to said voltage-controlled oscillator.

14. In electrical circuitry for monitoring the amount of electrical energy consumed by a system, including means for sensing the AC current flowing along an input bus into the system, means for generating a pulsed digital signal having a frequency representative of the magnitude of the input AC current, and means for counting the number of pulses of said digital signal during a given period of time; the improvement characterized by:

comparator means for comparing the number of pulses of said digital signal counted by the counting means to a predetermined number during said period of time; and output means for generating an output signal in response to said pulse number being equal to or greater than said predetermined number.

15. The improvement of claim 14 and further comprising alarm means in communication with said output means and responsive to said output signal for actuating an alarm to indicate that a given amount of electrical energy has been consumed for said time period.

16. Electrical circuitry for monitoring the cost of electrical energy consumed by a system over an extended period of time, comprising:

means for sensing the current flowing along an input but into the system and generating a DC signal having an amplitude representative of the magnitude of the input current;

oscillator means responsive to said DC signal for generating an AC signal having a frequency representative of the amplitude of the DC voltage, said oscillator having a variable resistor for adjusting the frequency of the AC signal to be representative of the rate of cost of said electrical energy;

switching means responsive to said AC signal for generating a pulsed digital signal having a frequency representative of the AC signal frequency;

counting means in communication with said switching means for counting the number of pulses of said digital signal during said extended period of time to provide the total cost of said energy consumption; and display means responsive to said counting means for displaying said total cost of energy consumption.

17. Electrical circuitry for monitoring the total cost of electrical energy consumed by a system over an input bus during an extended period of time, comprising:

electromagnetic means for sensing the magnitude of input current in said input bus;

rectifier means connected to said electromagnetic means for generating a DC voltage having an amplitude representative of the magnitude of said input current;

a voltage-controlled oscillator connected to said rectifier means to provide an AC signal having a frequency corresponding to the amplitude of said DC voltage and representative of the rate of cost of said electrical energy;

a multivibrator in communication with said voltage-controlled oscillator to generate a pulse train having a frequency corresponding to the frequency of said AC signal;

a series of digital counters in communication with said multivibrator for counting the number of pulses in said pulse train over said extended period of time;

display means for converting the digital count of said counters to alphanumeric data reflecting said total cost of energy consumption and for displaying said alphanumeric data;

means for sensing said series of counters and for generating an output signal in response to a predetermined count of said counters; and alarm means in communication with said counter sensing means and responsive to said output signal for actuating an alarm to indicate that a given total cost of electrical energy has been consumed for said extended time period.

* * * * *